ized Patent

(12) United States Patent
Inaba et al.

(10) Patent No.: US 9,183,951 B2
(45) Date of Patent: Nov. 10, 2015

(54) RESISTANCE CHANGE MEMORY AND TEST METHOD OF THE SAME

(71) Applicants: Tsuneo Inaba, Seongnam-si (KR); Dong Keun Kim, Icheon-si (KR)

(72) Inventors: Tsuneo Inaba, Seongnam-si (KR); Dong Keun Kim, Icheon-si (KR)

(*) Notice: Subject to any disclaimer, the term of this patent is extended or adjusted under 35 U.S.C. 154(b) by 67 days.

(21) Appl. No.: 14/201,534

(22) Filed: Mar. 7, 2014

(65) Prior Publication Data

US 2015/0070970 A1  Mar. 12, 2015

Related U.S. Application Data

(60) Provisional application No. 61/876,547, filed on Sep. 11, 2013.

(51) Int. Cl.

| G11C 13/00 | (2006.01) |
|---|---|
| G11C 29/12 | (2006.01) |
| G11C 8/08 | (2006.01) |
| G11C 29/06 | (2006.01) |
| G11C 29/50 | (2006.01) |
| G11C 11/16 | (2006.01) |

(52) U.S. Cl.
CPC ............ *G11C 29/12005* (2013.01); *G11C 8/08* (2013.01); *G11C 11/1675* (2013.01); *G11C 13/0069* (2013.01); *G11C 29/06* (2013.01); *G11C 29/50008* (2013.01); *G11C 11/16* (2013.01); *G11C 13/0004* (2013.01); *G11C 2013/009* (2013.01); *G11C 2029/1202* (2013.01)

(58) Field of Classification Search
CPC ............ G11C 13/002; G11C 13/0004; G11C 13/0069; G11C 8/08; G11C 11/16; G11C 11/1675; G11C 29/06; G11C 29/5008; G11C 2029/1202; G11C 29/12005
USPC .................... 365/148, 158, 163, 189.11, 201, 365/230.06, 239
See application file for complete search history.

(56) References Cited

U.S. PATENT DOCUMENTS

| 5,381,373 | A  * | 1/1995 | Ohsawa ......................... 365/201 |
| 6,285,610 | B1 * | 9/2001 | Chun ............................ 365/201 |
| 6,414,890 | B2 * | 7/2002 | Arimoto et al. ............... 365/201 |
| 2005/0068815 | A1 | 3/2005 | Garni et al. |
| 2008/0043553 | A1 | 2/2008 | Suzuki et al. |
| 2012/0069638 | A1 | 3/2012 | Matsuda et al. |

FOREIGN PATENT DOCUMENTS

| JP | 2004-348891 A | 12/2004 |
| JP | 2007-026477 A | 2/2007 |

* cited by examiner

*Primary Examiner* — Tan T. Nguyen
(74) *Attorney, Agent, or Firm* — Holtz, Holtz, Goodman & Chick PC

(57) ABSTRACT

According to one embodiment, a resistance change memory includes a memory cell array, an address counter, a word line driver, a power supply circuit, and a write driver. Memory cells include resistive storage elements and cell transistors. The power supply circuit generates a stress voltage different from a power supply voltage used to write data into the memory cells in a normal operation. The write driver applies the stress voltage across first bit and source lines to pass a stress current through the memory cell selected by a first word line. The write driver applies the stress voltage across second bit and source lines to pass the stress current through the memory cell selected by a second word line.

22 Claims, 9 Drawing Sheets

RESISTANCE CHANGE MEMORY AND TEST METHOD OF THE SAME

CROSS-REFERENCE TO RELATED APPLICATIONS

This application claims the benefit of U.S. Provisional Application No. 61/876,547, filed Sep. 11, 2013, the entire contents of which are incorporated herein by reference.

FIELD

Embodiments described herein relate generally to a resistance change memory and a test method of the same.

BACKGROUND

Resistance change memories such as a magnetic random access memory (hereinafter referred to as an MRAM) that uses magnetoresistive effects of a ferromagnetic substance have been recently drawing more attention as next-generation solid-state nonvolatile memories capable of high-speed reading and writing, having high capacities, and capable of low-power-consumption operation. In particular, a magnetoresistive element having a magnetic tunnel junction used in the MRAM is also referred to as a magnetic tunnel junction (MTJ) element, and has been dawning attention since it had been proved to show a high magnetoresistance rate. The MTJ element has a three-layer stacked layer structure including a storage layer variable in magnetization direction, an insulator layer, and a reference layer which faces the storage layer and which maintains a predetermined magnetization direction.

DETAILED DESCRIPTION

Hereinafter, a resistance change memory according to an embodiment will be described with reference to the drawings. Here, a magnetic random access memory (MRAM) comprising a magnetic tunnel junction (MTJ) element is shown by way of example as the resistance change memory. In the following description, like reference signs are provided to components having the same functions and configurations, and repeated explanations are given only when necessary.

Embodiments shown below illustrate devices and methods which embody the technical concepts of the embodiments, and the materials, shapes, structures, and locations of the components are not limited to those specified below.

In general, according to one embodiment, a resistance change memory comprises a memory cell array, an address counter, a word line driver, a power supply circuit, and a write driver. Memory cells comprising resistive storage elements and cell transistors are arrayed in the memory cell array. The memory cells are connected to bit lines and source lines. The cell transistors are connected to word lines. The address counter outputs an address signal to select the bit line, the source line, and the word line. The word line driver drives the word line. The power supply circuit generates a stress voltage different from a power supply voltage used to write data into the memory cells in a normal operation. The write driver is configured to apply the stress voltage to the memory cells connected between the bit lines and the source lines. The address counter selects a first word line from the word lines, and the word line driver drives the first word line. The address counter selects a first bit line and a first source line from the bit lines and the source lines. The write driver applies the stress voltage across the first bit line and the first source line to pass a stress current through the memory cell selected by the first word line. The address counter is incremented to select a second word line from the word lines, and the word line driver drives the second word line. The address counter is incremented to select a second bit line and a second source line from the bit lines and the source lines. The write driver applies the stress voltage across the second bit line and the second source line to pass a stress current through the memory cell selected by the second word line.

First Embodiment

Figure 1:
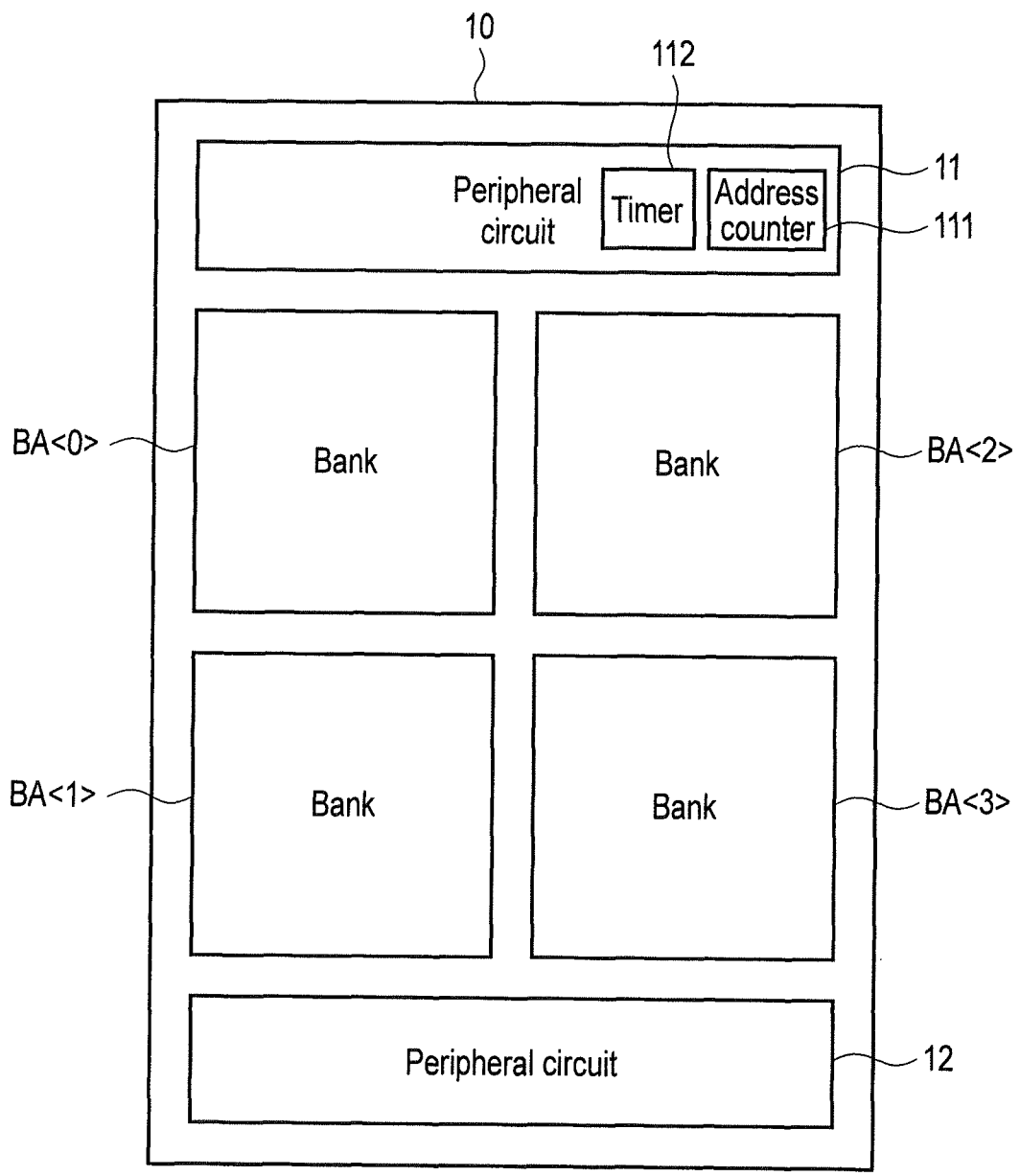
FIG. 1 is a block diagram showing a configuration of an MRAM according to a first embodiment.

FIG. 1 is a block diagram showing a configuration of an MRAM according to a first embodiment.

The MRAM 10 comprises banks BA<0>, BA<1>, BA<2>, and BA<3>, and peripheral circuits 11 and 12. The banks BA<0> to BA<3> have memory cells to store data. Each of the banks BA<0> to BA<3> will hereinafter be referred to as a bank BA. Although four banks BA are shown here, it should be appreciated that four or more banks may be provided. The configuration of the bank BA will be described later in detail. The peripheral circuit 11 has an address counter 111 and a timer circuit 112, and controls the operation of the banks and processes, for example, write and read commands. The peripheral circuit 12 has, for example, a circuit to control the input and output of data. The address counter 111 counts bit lines, source lines, and word lines connected to the memory cells during a stress test. That is, the address counter 111 outputs an address signal to sequentially select the bit lines, the source lines, and the word lines. The timer circuit 112 measures the time of the application of a stress voltage during the stress test.

Figure 2:
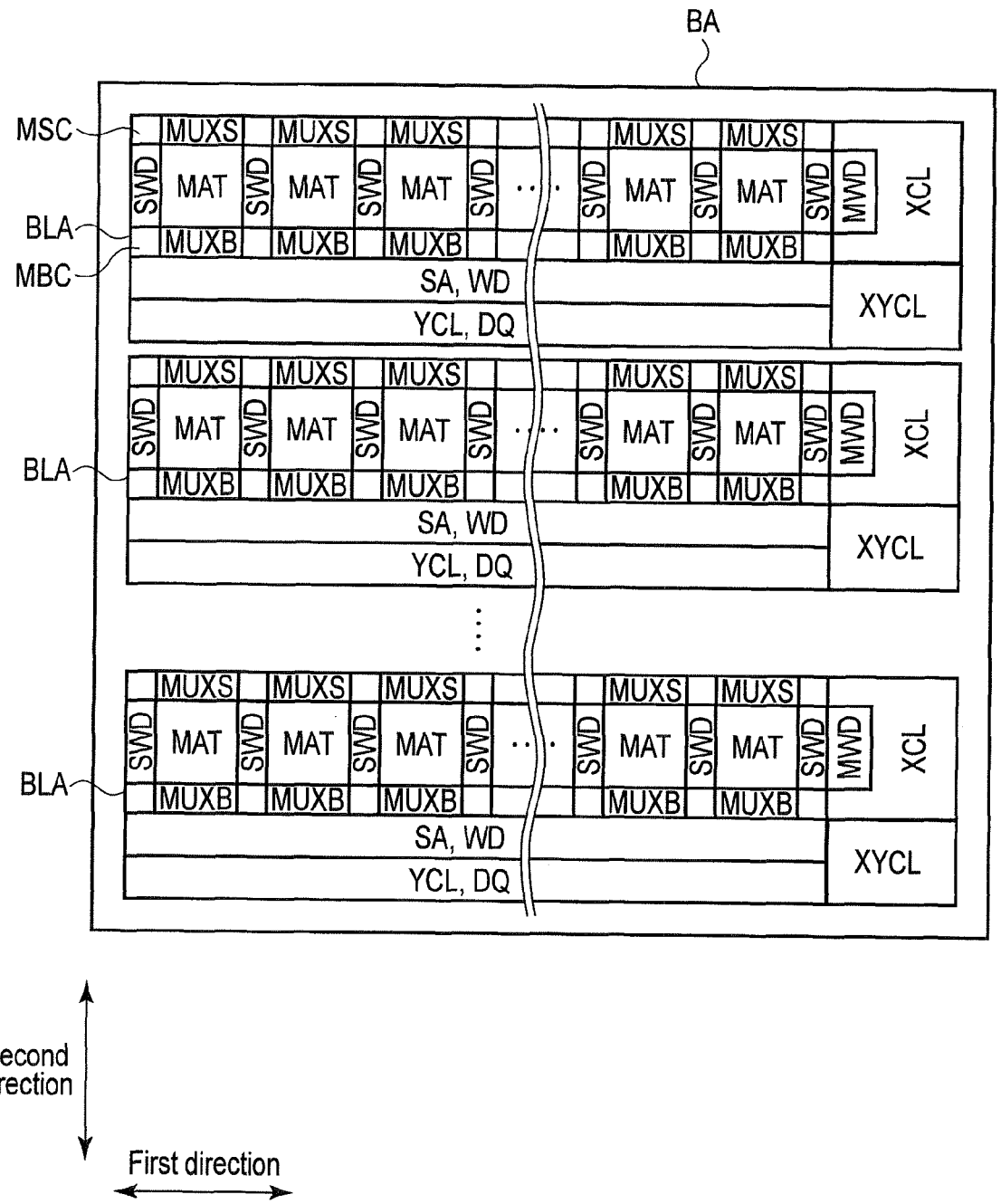
FIG. 2 is a block diagram showing a configuration of a bank in the MRAM.

FIG. 2 is a block diagram showing a configuration of the bank BA in the MRAM 10.

The bank BA comprises blocks BLA. The blocks BLA have memory cell arrays MAT arrayed in a first direction. The memory cell array MAT is a region where sub bit lines, sub source lines, and sub word lines are periodically arrayed in succession, and memory cells are disposed at the intersections of the sub bit lines, the sub source lines, and the sub word lines. Details of the memory cell array MAT will be described later in detail. The blocks BLA are arrayed in a second direction.

On both sides of the memory cell array MAT in the first direction, sub word line drivers SWD are disposed across the memory cell array MAT. A multiplexer MUXB is disposed on one side of the memory cell array MAT in the second direction, and a multiplexer MUXS is disposed on the other side. Multiplexer controllers MBC which control the multiplexer MUXB are disposed on both sides of the multiplexer MUXB in the first direction. Moreover, multiplexer controllers MSC which control the multiplexer MUXS are disposed on both sides of the multiplexer MUXS in the first direction.

The sub word line drivers SWD drive the sub word lines arrayed in the memory cell arrays MAT. The multiplexer MUXB selects the sub bit lines arrayed in the memory cell array MAT. The multiplexer controller MBC controls the selection of the sub bit lines by the multiplexer MUXB. The multiplexer MUXS selects the sub source lines arrayed in the memory cell array MAT. The multiplexer controller MSC controls the selection of the sub source lines by the multiplexers MUXS.

A sense amplifier SA and a write driver WD are disposed on one side of the memory cell arrays MAT in the second direction. Moreover, a column controller YCL, and a data circuit DQ to input and output data are disposed on one side of the sense amplifier SA and the write driver WD.

A main word line driver MWD is disposed on one side of the sub word line driver SWD in the first direction, and a row controller XCL is disposed on one side of the main word line driver MWD. Moreover, a row column controller XYCL is disposed on one side of the column controller YCL and on one side of the row controller XCL.

The sense amplifier SA reads data stored in the memory cells. The write driver WD applies a write voltage across the sub bit lines and the sub source lines, and write data in the memory cells. The write driver WD applies a stress voltage across the sub bit lines and the sub source lines, and passes a stress current through the memory cells.

The column controller YCL controls the operations of the sense amplifier SA and a word line driver WD. The main word line driver MWD is connected to the sub word line drivers SWD via a multiplexer (not shown). The row controller XCL controls the operation of the main word line driver MWD. The row column controller XYCL controls the operations of the column controller YCL and the row controller XCL.

Figure 3:
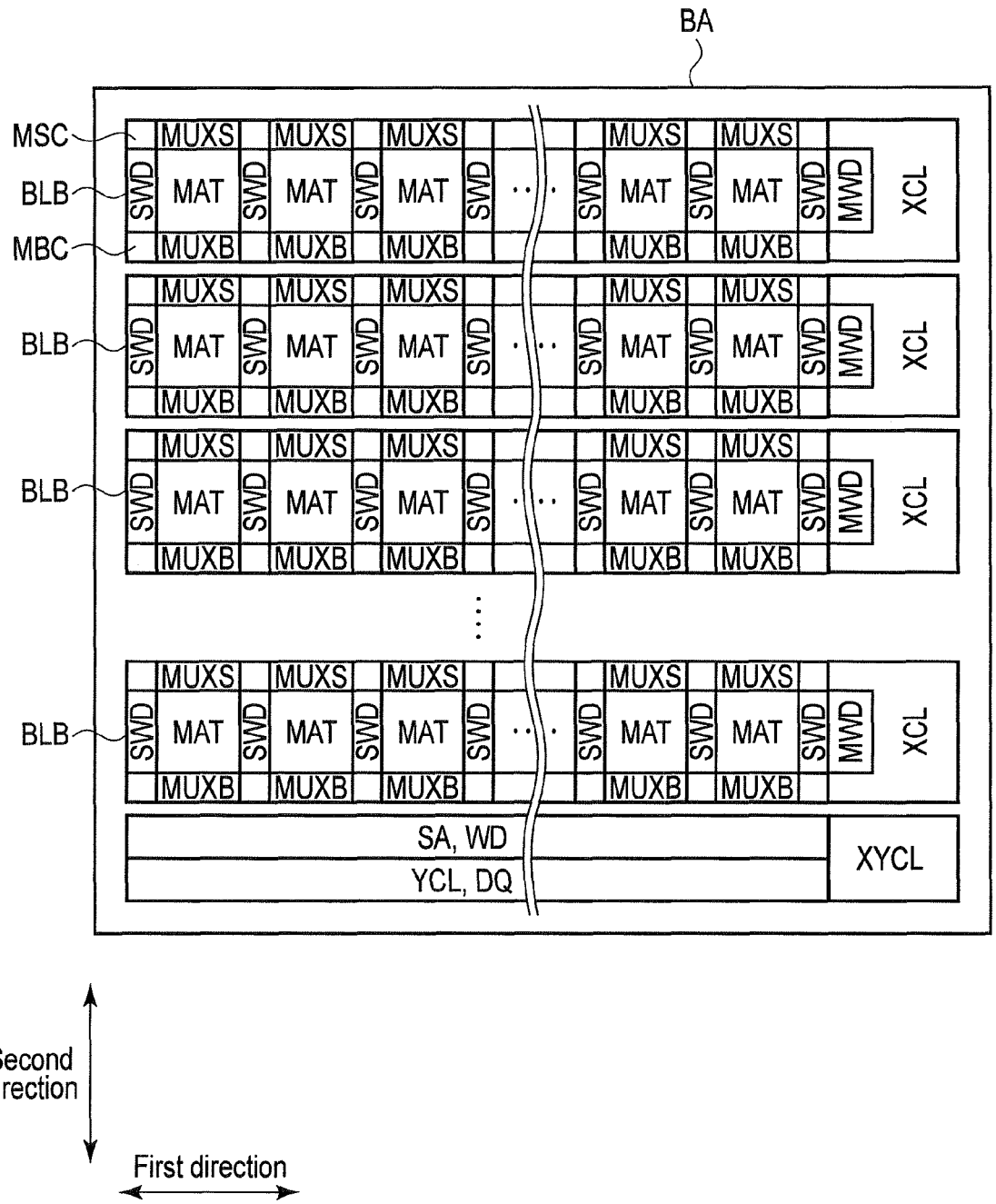
FIG. 3 is a block diagram showing another configuration of a bank in the MRAM.

The bank BA may have a hierarchical bit line structure shown in FIG. 3. FIG. 3 is a block diagram showing another configuration of the bank BA in the MRAM 10.

The bank BA comprises blocks BLB, the sense amplifier SA, the word line driver WD, the column controller YCL, the data circuit DQ, and the row column controller XYCL. The blocks BLB are arrayed in the second direction. The sense amplifier SA and the word line driver WD are disposed on one side of the blocks BLB in the second direction. The column controller YCL and the data circuit DQ are disposed on one side of the sense amplifier SA and the write driver WD. Moreover, the row column controller XYCL is disposed on one side of the column controller YCL.

The block BLB has the following configuration.

The block BLB has the memory cell arrays MAT arrayed in the first direction. The sub word line drivers SWD are disposed across the memory cell array MAT on both sides of the memory cell array MAT in the first direction. The multiplexer MUXB is disposed on one side of the memory cell array MAT in the second direction, and the multiplexer MUXS is disposed on the other side. The multiplexer controllers MBC which control the multiplexer MUXB are disposed on both sides of the multiplexer MUXB in the first direction. Moreover, the multiplexer controllers MSC which control the multiplexer MUXS are disposed on both sides of the multiplexer MUXS in the first direction.

The main word line driver MWD is disposed on one side of the sub word line driver SWD in the first direction, and the row controller XCL is disposed on one side of the main word line driver MWD.

Figure 4A:
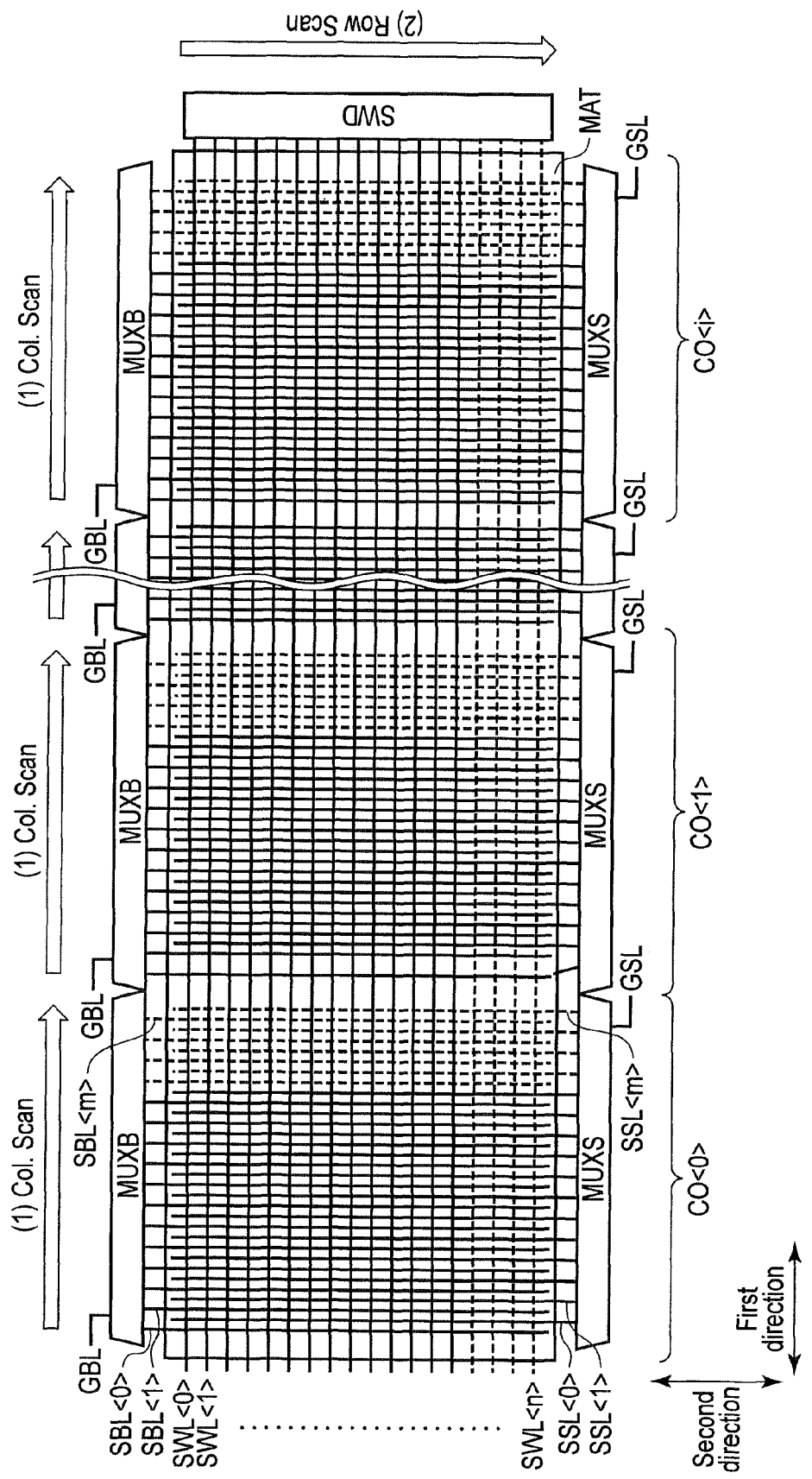
FIG. 4A is a diagram showing a configuration of a memory cell array in a bank of the MRAM.

FIG. 4A is a diagram showing a configuration of the memory cell array MAT in the bank BA of the MRAM 10.

The memory cell array MAT has the following configuration.

Sub word lines SWL<0>, SWL<1>, ..., SWL<n> extending in the first direction are arrayed in the second direction. Sub bit lines SBL<0>, SBL<1>, ..., SBL<m> and sub source lines SSL<0>, SSL<1>, ..., SSL<m> extending in the second direction are arrayed in the first direction. The sub word lines, the sub bit lines, and the sub source lines intersect. The memory cells are disposed at the intersections of the sub word lines, the sub bit lines, and the sub source lines.

The sub word line driver SWD is disposed at one end of the sub word lines SWL<0> to SWL<n> to drive these sub word lines. The sub word lines have normal sub word lines used to store data, and redundancy sub word lines used in place of faulty sub word lines when the normal sub word lines are faulty. The redundancy sub word lines are indicated by broken lines.

The multiplexers MUXB are disposed on one side of the sub bit lines in the second direction, and global bit lines GBL are connected to the multiplexers MUXB. The multiplexers MUXS are disposed on one side of the sub source lines in the second direction, and global source lines GSL are connected to the multiplexers MUXS.

The sub bit lines have normal sub bit lines used to store data, and redundancy sub bit lines used in place of faulty sub bit lines when the normal sub bit lines are faulty. The redundancy sub bit lines are indicated by broken lines. Similarly, the sub source lines have normal sub source lines used to store data, and redundancy sub source lines used in place of faulty sub source lines when the normal sub source lines are faulty. The redundancy sub source lines are indicated by broken lines.

As described above, each of column sections CO<0> to CO<i> includes a bit line group and a source line group that are selected by one multiplexer MUXB and one multiplexer MUXS. The column sections CO<0> to CO<i> are arrayed in the first direction to form the memory cell array MAT. It is to be noted that i indicates 0, 1, 2, ..., and i.

Figure 4B:
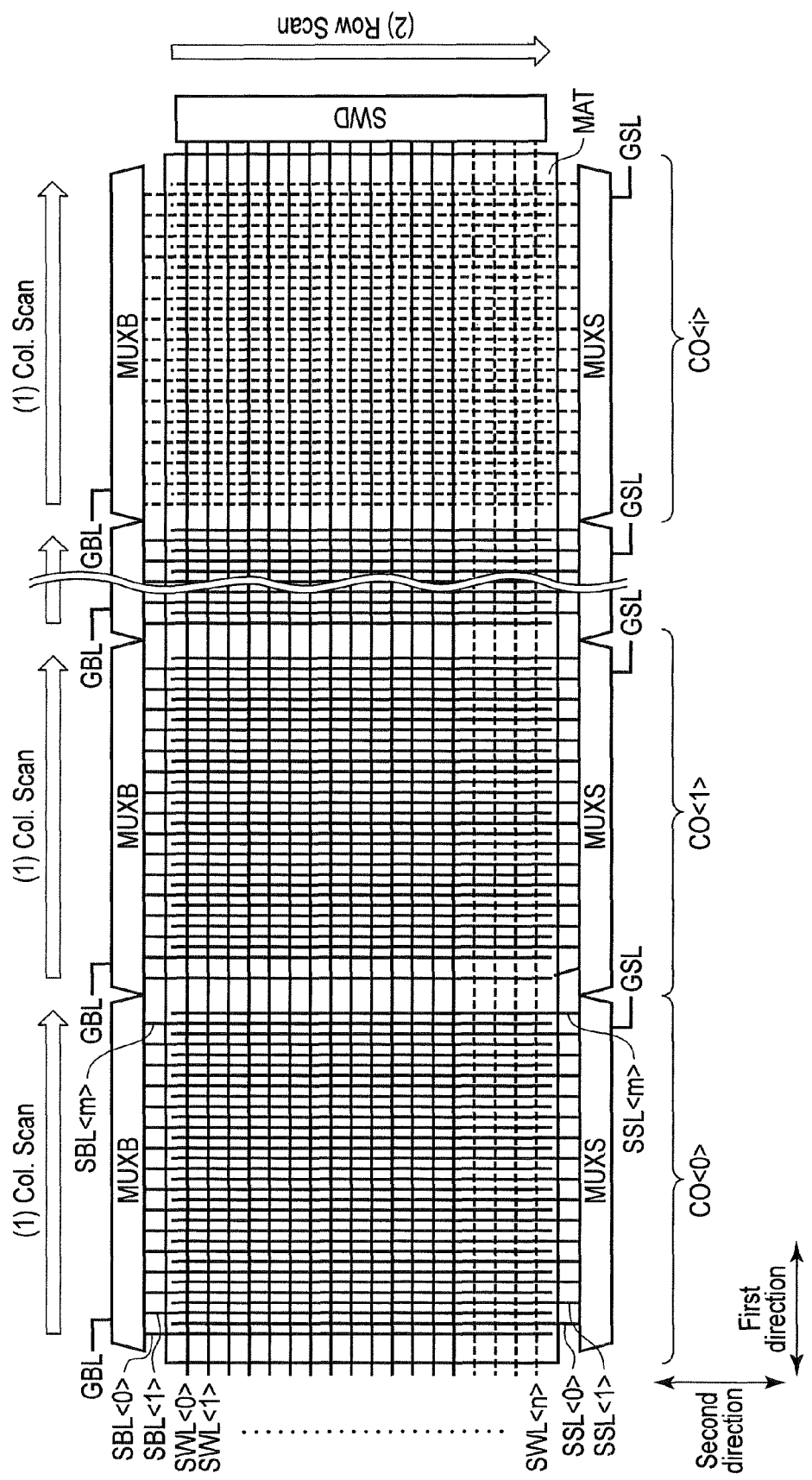
FIG. 4B is a diagram showing another configuration of a memory cell array in a bank BA of the MRAM.

FIG. 4B shows another configuration of the memory cell array MAT in the bank BA of the MRAM. Here, components different from the components shown in FIG. 4A are only described.

As shown in FIG. 4B, for example, the column section CO<i> adjacent to the sub word line driver SWD has the redundancy sub bit lines and sub source lines. The redundancy sub bit lines and sub source lines are indicated by broken lines.

For example, the column section CO<0> is replaced by the column section CO<i> when some of the sub bit lines or sub source lines in the column section CO<0> are faulty.

Figure 5:
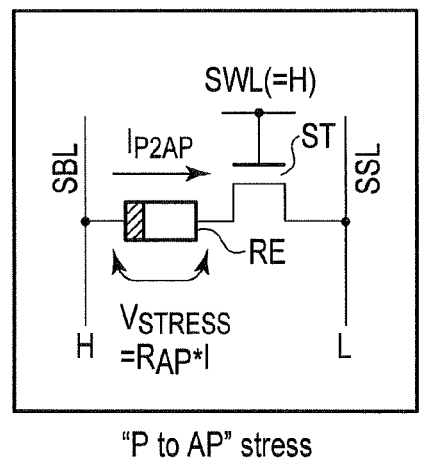
FIGS. 5 and 6 are circuit diagrams showing a memory cell disposed in the memory cell array and stress conditions of a stress test.

FIG. 5 is a circuit diagram showing the configuration of the memory cell disposed in the memory cell array MAT. FIG. 5 also shows stress conditions for the memory cell implemented in a stress test.

The memory cell has, for example, a magnetic tunnel junction (MTJ) element RE as a resistive storage element, and a cell transistor ST. The MTJ element RE and the cell transistor ST are connected in series between the sub bit line SBL and the sub source line SSL. Specifically, the sub bit line SBL is connected to one end of the MTJ element RE, and the other end of the MTJ element RE is connected to one end of the current path of the cell transistor ST. Moreover, the other end of the current path of the cell transistor ST is connected to the sub source line SSL.

The MTJ element RE has at least two magnetic layers (a storage layer and a reference layer), and a nonmagnetic layer provided between the storage layer and the reference layer.

The storage layer and the reference layer each have an axis of easy magnetization in a direction perpendicular to a film plane. The magnetization direction of the storage layer is variable, and changes before and after writing. The magnetization direction of the reference layer is invariable or fixed as compared with that of the storage layer, and does not change before and after writing. The nonmagnetic layer is also referred to as a tunnel barrier layer, and is made of an insulating film of an oxide such as MgO.

Now, the stress conditions for the memory cell implemented in the stress test are described. First, a "high" is applied to the gate of the cell transistor ST in the memory cell, and the cell transistor ST is turned on. The "high" is then applied to the sub bit line SBL, and a "low" is applied to the sub source line SSL. As a result, a stress current $I_{P2AP}$ runs through the MTJ element RE. At the same time, a stress voltage ($V=R_{AP} \cdot I_{P2AP}$) is applied to both ends of the MTJ element RE. The resistance $R_{AP}$ is the resistance of the MTJ element when the magnetization direction of the storage layer is antiparallel to the magnetization direction of the reference layer. This stress condition is a condition for the magnetization direction of the storage layer to shift from a direction parallel to the magnetization direction of the reference layer to a direction antiparallel thereto.

Figure 6:
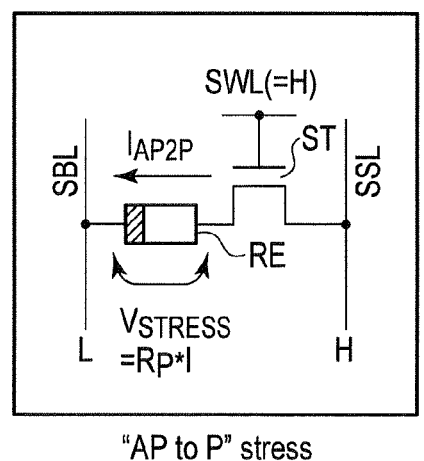

As shown in FIG. 6, a condition may be set such that the "low" is applied to the sub bit line SBL and the "high" is applied to the sub source line SSL. As a result, a stress current $T_{AP2P}$ runs through the MTJ element RE. At the same time, a stress voltage ($V=R_P \cdot I_{AP2P}$) is applied to both ends of the MTJ element RE. The resistance $R_P$ is the resistance of the MTJ element when the magnetization direction of the storage layer is parallel to the magnetization direction of the reference layer. This stress condition is a condition for the magnetization direction of the storage layer to shift from a direction antiparallel to the magnetization direction of the reference layer to a direction parallel thereto. Here, the stress condition shown in FIG. 5 is used.

Figure 7:
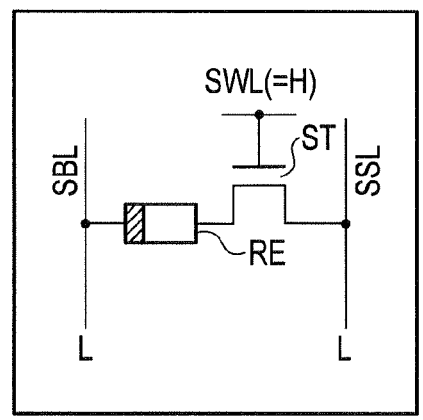
FIG. 7 is a circuit diagram showing stress conditions for a cell transistor of the memory cell.

FIG. 7 is a circuit diagram showing stress conditions for the cell transistor ST of the memory cell.

When the stress test is conducted for the cell transistor ST of the memory cell, the "low" is applied to the sub bit line SBL and the sub source line SSL by the write driver WD, and the "high" is applied to the sub word line SWL by the sub word line driver SWD. In this way, a withstand voltage of a gate insulating film of the cell transistor ST is tested.

Figure 8:
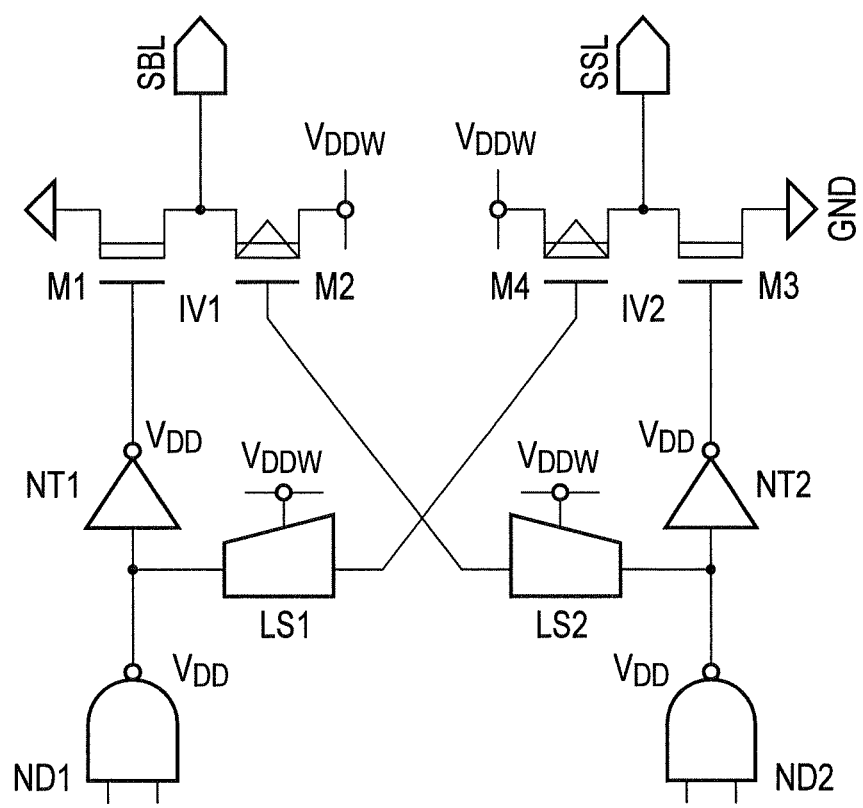
FIG. 8 is a circuit diagram showing a configuration of a write driver used in the stress test.

FIG. 8 is a circuit diagram showing a configuration of the write driver WD used in the stress test.

The write driver WD has inverters IV1 and IV2, NOT circuits NT1 and NT2, NAND circuits ND1 and ND2, and level shifters LS1 and LS2. The inverter IV1 has an re-channel MOS field effect transistor (hereinafter referred to as an nMOS transistor) M1 and a p-channel MOS field effect transistor (hereinafter referred to as a pMOS transistor) M2. The inverter IV2 has an nMOS transistor M3 and a pMOS transistor M4. The MOS transistors M1 to M4 are formed by high-withstand-voltage transistors.

An output end of the NAND circuit ND1 is connected to the gate of the nMOS transistor M1 via the NOT circuit NT1. The output end of the NAND circuit ND1 is also connected to the gate of the pMOS transistor M4 via the level shifter LS1. An output end of the NAND circuit ND2 is connected to the gate of the nMOS transistor M3 via the NOT circuit NT2. The output end of the NAND circuit ND2 is also connected to the gate of the pMOS transistor M2 via the level shifter LS2.

The write driver WD shown in FIG. 8 generates a stress voltage VDDW applied to the memory cell in the stress test. The stress voltage VDDW can be set to a voltage higher than a power supply voltage VDD or a lower voltage by the level shifters LS1 and LS2. The write driver WD can also be used for a normal write operation to write data into the memory cell. In this write operation, the write driver WD generates the voltage VDDW as a write voltage. In this case, if the write voltage VDDW is set to the voltage lower than the power supply voltage VDD, the deterioration of the reliability of the memory cell caused by the write operation can be prevented. The power supply voltage VDD is a voltage used in a normal operation such as reading. The power supply voltage VDD is used by a read circuit, for example, to read data from the memory cell.

Figure 9:
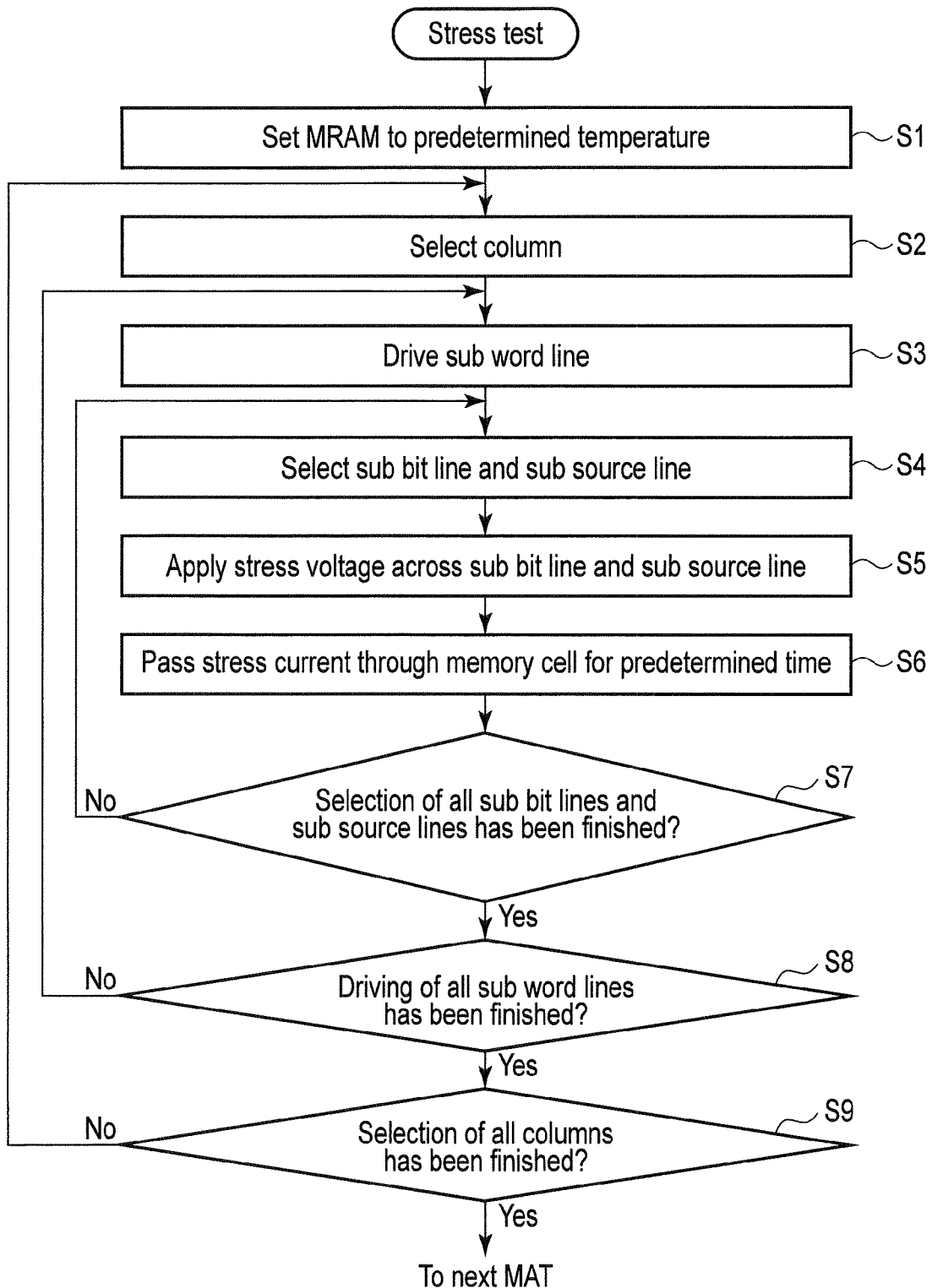
FIG. 9 is a flowchart showing the flow of a stress test according to the first embodiment.

Now, the flow of the stress test for the memory cell of the MRAM according to the first embodiment is described with reference to FIG. 4 and FIG. 9. FIG. 9 is a flowchart showing the flow of the stress test for the memory cell.

First, a wafer in which the MRAM is formed is set in a burn-in test apparatus. When the wafer is heated to a predetermined temperature (step S1), a column in the memory cell array MAT of the MRAM is selected (step S2).

One sub word line SWL<0> (first word line) is then driven by the sub word line driver SWD (step S3). Thus, the cell transistor ST of the memory cell is turned on.

One sub bit line SBL<0> and one sub source line SSL<0> (first bit line and first source line) are then respectively selected by the multiplexers MUXB and MUXS (step S4). A stress voltage is applied across the sub bit line SBL<0> and the sub source line SSL<0> by the write driver WD (step S5). That is, the stress voltage is given to the sub bit line SBL<0>, and a reference voltage such as a ground voltage is supplied to the sub source line SSL<0>. Thus, a stress current is passed through the MTJ element RE of the memory cell connected between the sub bit line SBL<0> and the sub source line SSL<0>.

Then there is a wait for a predetermined time set by the timer circuit 112 while the passage of the stress current is maintained (step S6).

Whether the selection of all the sub bit lines SBL and sub source lines SSL in the column has been finished is then determined (step S7). If the selection of all the sub bit lines SBL and sub source lines SSL has not been finished, the flow returns to step S4, and processing from step S4 to step S7 is repeated.

That is, while the sub word line SWL<0> is being driven, the address counter 111 is incremented, and the next sub bit line SBL<1> and sub source line SSL<1> (second sub bit line and second sub source line) are respectively selected by the multiplexers MUXB and MUXS. A stress voltage is applied across the sub bit line SBL<1> and the sub source line SSL<1> by the write driver WD, and a stress current is passed through the MTJ element RE.

Thus, while the sub word line SWL<0> is being driven, the sub bit line SBL and the sub source line SSL are sequentially selected by the multiplexers. The stress voltage is then applied across the sub bit line SBL and the sub source line SSL, and the stress current is sequentially passed through the selected memory cells. When the selection of all the sub bit lines and sub source lines in one column (multiplexer) and the supply of the stress current through the memory cells have been finished, the driving of the sub word line SWL<0> is stopped.

Whether the driving of all the sub word lines SWL in the column has been finished is then determined (step S8). If the driving of all the sub word lines SWL has not been finished, the flow returns to step S3, and processing from step S3 to step S8 is repeated.

That is, the address counter 111 is incremented, and the next sub word line SWL<1> (second word line) is driven by the sub word line driver SWD (step S3). Thus, the cell transistor ST of the memory cell is turned on.

One sub bit line SBL<0> and one sub source line SSL<0> are then selected by the multiplexers MUXB and MUXS (step S4). A stress voltage is applied across the sub bit line SBL<0> and the sub source line SSL<0> by the write driver WD (step S5). Thus, a stress current is passed through the MTJ element RE of the memory cell connected between the sub bit line SBL<0> and the sub source line SSL<0>. Then there is a wait for a predetermined time set by the timer circuit 112 while the passage of the stress current is maintained (step S6).

Whether the selection of all the sub bit lines SBL and sub source lines SSL in the column has been finished is determined (step S7). If the selection of all the sub bit lines SBL and sub source lines SSL has not been finished, the address counter 111 is incremented while the sub word line SWL<1> is being driven, and the next sub bit line SBL<1> and sub source line SSL<1> are respectively selected by the multiplexers MUXB and MUXS. A stress voltage is then applied across the sub bit line SBL<1> and the sub source line SSL<1>, and a stress current is passed through the MTJ element RE.

Thus, while the sub word line SWL<1> is being driven, the sub bit line SBL and the sub source line SSL are sequentially selected by the multiplexers. The stress voltage is then applied across the sub bit line SBL and the sub source line SSL, and the stress current is sequentially passed through the selected memory cells. When the selection of the sub bit lines and sub source lines in one column (multiplexer) and the supply of the stress current through the memory cells have been finished, the driving of the sub word line SWL<1> is stopped.

Thus, when the driving of all the sub word lines SWL in the column has finished and the supply of the stress current through all the memory cells in the column have been finished, whether the selection of all the columns in the memory cell array MAT has been finished is determined (step S9). When the selection of all the columns has not been finished, the flow returns to step S2, and processing from step S2 to step S9 is repeated. When the selection of all the columns has been finished, the flow moves to the next memory cell array MAT, and the processing from step S2 to step S9 is again repeated.

When the stress test for the MTJ element RE of the memory cell in the MRAM has been thus finished, a stress test for the cell transistor ST of the memory cell is then conducted under the stress conditions shown in FIG. 7, and the stress test (wafer burn-in test) for the MRAM is finished.

A die sort test for the MRAM is then conducted. In the die sort test, an electric operation test is conducted for the memory cells in the MRAM, and the MRAM is sorted into normally operating semiconductor chip or faulty semiconductor chip.

A predetermined temperature at which the wafer is set in the above-mentioned stress test is described below. The predetermined temperature is, for example, higher than a guaranteed operating temperature of the MRAM and lower than the lowest value of the Curie temperature of each of the magnetic substances constituting the MTJ element. Specifically, suppose that, for example, the storage layer and the reference layer in the MTJ element are made of materials such as Co, Fe, and B. In this case, the predetermined temperature is set to a temperature higher than the guaranteed operating temperature of the MRAM and lower than the lowest value of the Curie temperature of each of the materials Co, Fe, and B. For example, the wafer in which the MRAM is formed is set to a range of 150° to 250°.

Although the stress test (wafer burn-in test) shown in FIG. 9 is conducted for the wafer in the example described, the stress test is not exclusively conducted for the wafer. The stress test may be conducted in a similar manner for the semiconductor chips after they are diced.

In the stress test described above, while the sub word line is first driven, and the sub bit line and the sub source line are then scanned, the stress current is passed through the memory cell. However, while the sub bit line and the sub source line may be first driven and the sub word line may be then scanned, the stress current is passed through the memory cell.

The stress voltages applied to the MTJ element RE and the cell transistor ST of the memory cell may be the same or may be different voltages. For example, the write driver WD applies a first voltage to the MTJ element RE. The sub word line driver SWD applies a second voltage to the cell transistor ST. The first voltage may be the same as or different from the second voltage.

Although one word line in one bank is activated and tested in the stress test described above, more than one word line in more than one bank may be simultaneously activated and tested. This can reduce the time required for the stress test. Even write drivers in one bank may first be simultaneously activated and tested, and then odd write drivers in the same bank may be simultaneously activated and tested. Thus, if the stress tests are conducted separately for the even and odd write drivers, the stress current passed through a power supply line in each stress test can be reduced by half, and problems can be eliminated when the current that can be passed through the power supply line is limited.

In the first embodiment described above, the stress test (burn-in test) is conducted for the wafer in which the random access memory is formed or for the semiconductor chip. That is, the test is conducted to heat the wafer of the MRAM or the semiconductor chip to the predetermined temperature and apply the stress current to the memory cell in the MRAM. Consequently, initial faults occurring in the MRAMs can be reduced in advance, and the MRAMs can be efficiently screened. Moreover, faults detected in the subsequently conducted die sort test can be reduced.

Second Embodiment

In a second embodiment, a stress test (burn-in test) is conducted in an environment in which a magnetic field is applied to the MRAM. The configurations of the MRAM, banks, memory cell arrays, and memory cells and stress conditions according to the second embodiment are similar to those according to the first embodiment shown in FIGS. 1 to 8, and are therefore not described.

Figure 10:
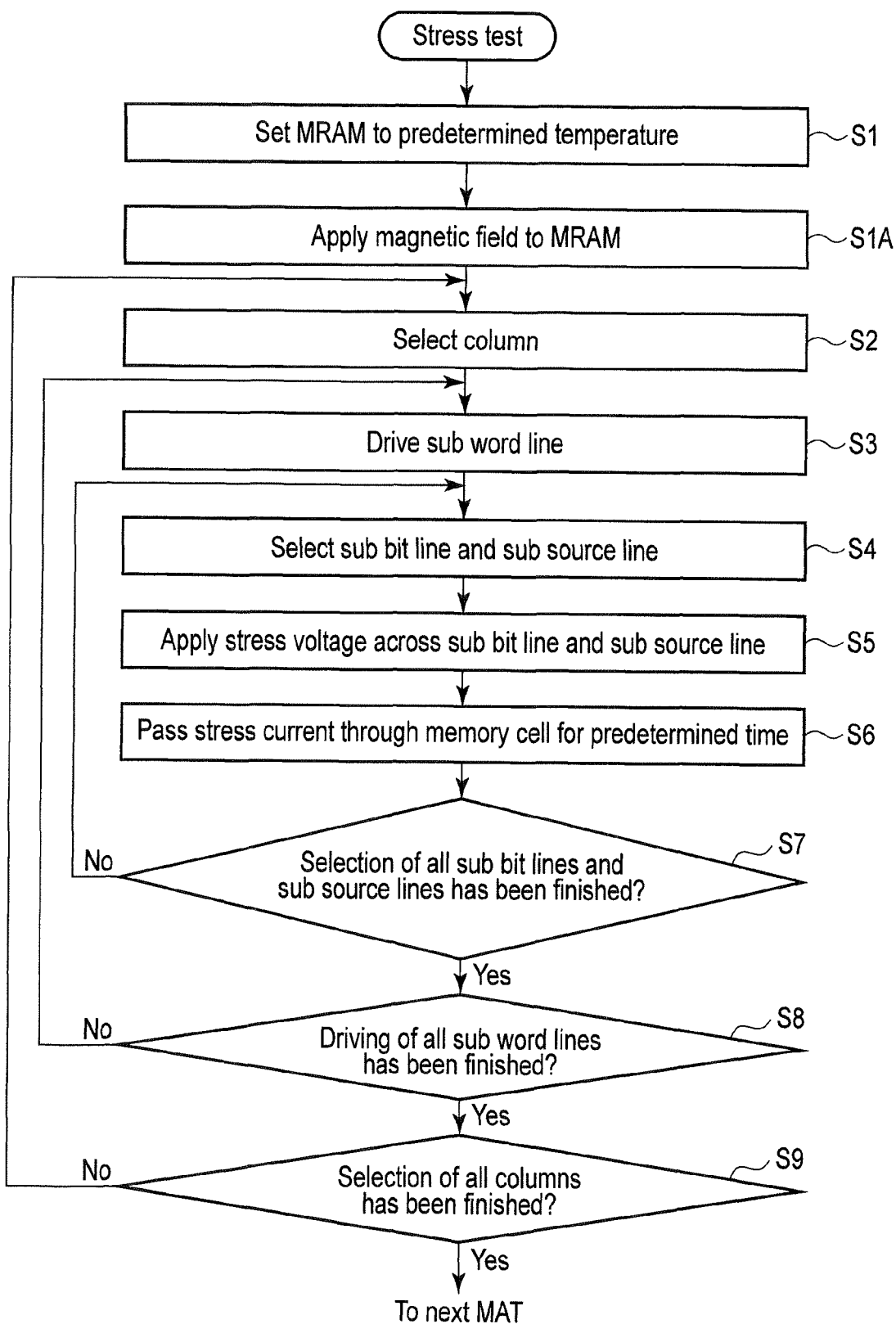
FIG. 10 is a flowchart showing the flow of a stress test according to a second embodiment.

FIG. 10 is a flowchart showing the flow of the stress test according to the second embodiment. In this stress test, a magnetic field is applied to the MRAM.

First, a wafer in which the MRAM is formed is set in a burn-in test apparatus. Then there is a wait before the wafer is heated to a predetermined temperature (step S1). Further, a magnetic field is applied to the MRAM (step S1A). One of the heating of the wafer and the application of the magnetic field may be conducted first, or both may be simultaneously conducted. Moreover, while the magnetic field may be applied to the whole MRAM or the whole wafer, the magnetic field has only to be applied to at least the memory cell through which a stress current is passed.

The subsequent procedures for selecting a memory cell and applying the stress current to the selected memory cell are similar to the above-mentioned procedures in steps S2 to S9 in FIG. 9.

The application of the magnetic field to the MRAM is described below in detail.

As a first method, a magnetic field antiparallel (in the opposite direction) to the magnetization direction of a reference layer in an MTJ element is applied. In this way, weak reference layers, that is, reference layers that are easily switched in magnetization direction are screened.

When the magnetization direction of the reference layer is switched, writing is not performed normally in the MTJ element having a shift adjustment layer due to the magnetizations of the shift adjustment layer and the reference layer. In an MTJ element having no shift adjustment layer as well, a write current which changes the magnetization direction of a storage layer varies depending on whether P→AP or AP→P if the magnetization direction of the reference layer is switched. Therefore, writing is not performed as intended. P indicates that the magnetization directions of the storage layer and the reference layer are parallel to each other, and AP indicates that the magnetization directions are antiparallel to each other.

Consequently, being able to screen the MTJ element having the reference layer that is easily switched in magnetization direction is effective, and is especially effective in the MTJ element having the shift adjustment layer. The memory cell having the switched reference layer is detected as an unwritable memory cell if a die sort test is conducted later.

During the stress test, the application of a magnetic field antiparallel to the magnetization direction of the reference layer may be maintained, or parallel and antiparallel magnetic fields may be alternately applied.

Although electricity is applied to the MTJ element of the memory cell in the stress test shown in FIG. 10, the stress test may be a test in which no electricity is applied, that is, a test in which temperature and magnetic field loads are applied to the memory cell.

A method in which a magnetic field is applied in a direction oblique to the magnetization direction of the reference layer in the MTJ element may be used as a second method.

In the second embodiment described above, the stress test (burn-in test) is conducted by applying the magnetic field to the wafer in which the magnetic random access memory is formed or to the semiconductor chip. That is, the test is conducted by heating the wafer of the MRAM or the semiconductor chip to the predetermined temperature and applying a magnetic field to apply the stress current to the memory cell in the MRAM. Consequently, initial faults occurring in the MRAMs can be reduced in advance, and the MRAMs can be efficiently screened. Moreover, faults detected in the subsequently conducted die sort test can be reduced.

The configurations of the whole magnetic random access memory, the memory cell array, and memory cell according to the present embodiment are not limited to the configurations in the examples described above. For example, it is possible to use configurations disclosed in the specification of U.S. Pat. No. 7,649,792 and in the specification of U.S. Patent Application Publication No. 2012/0286339. The entire contents of these specifications are incorporated herein by reference.

Although the application to the MRAM that uses the magnetoresistive element is described in the examples according to the above embodiments, the embodiments are not limited thereto. It is also applicable to resistance change memories such as a resistive random access memory (ReRAM) that uses a variable resistive element or a phase change random access memory (PCRAM) that uses a phase change element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
a memory cell array in which memory cells comprising resistive storage elements and cell transistors are arrayed, the memory cells being connected to bit lines and source lines, the cell transistors being connected to word lines;
an address counter which outputs an address signal to select a bit line, a source line, and a word line;
a word line driver which drives the word line;
a power supply circuit which generates a stress voltage different from a power supply voltage used to write data into the memory cells in a normal operation; and
a write driver configured to apply the stress voltage to the memory cells connected between the bit lines and the source lines,
wherein the address counter selects a first word line from the word lines, and the word line driver drives the first word line,
the address counter selects a first bit line and a first source line from the bit lines and the source lines,
the write driver applies the stress voltage across the first bit line and the first source line to pass a stress current through the memory cell selected by the first word line,
the address counter is incremented to select a second word line from the word lines, and the word line driver drives the second word line,
the address counter is incremented to select a second bit line and a second source line from the bit lines and the source lines, and
the write driver applies the stress voltage across the second bit line and the second source line to pass a stress current through the memory cell selected by the second word line.

2. The resistance change memory according to claim 1, further comprising a timer circuit which sets a time of applying the stress voltage,
wherein the write driver applies the stress voltage in accordance with the time set by the timer circuit.

3. The resistance change memory according to claim 1, wherein
the write driver applies, to the memory cells, a write voltage different from a power supply voltage used to read data from the memory cells when writing data into the memory cells.

4. The resistance change memory according to claim 3, wherein
the write voltage is lower than the power supply voltage.

5. The resistance change memory according to claim 1, further comprising a multiplexer which is connected to the bit lines and which selects the first bit line from the bit lines,
wherein the address counter outputs a selection signal to the multiplexer to select the first bit line, and the write driver is connected to the first bit line via the multiplexer.

6. The resistance change memory according to claim 1, further comprising:
multiplexers which are connected to the bit lines and which select the first bit line from the bit lines; and
global bit lines connected to the multiplexers,
wherein the address counter outputs a selection signal to the multiplexers to select the first bit line, and the write driver is connected to the first bit line via the multiplexers.

7. The resistance change memory according to claim 5, wherein
the first word line is activated by the write driver, and the bit lines are then sequentially selected by the multiplexer, and
the second word line is then activated by the write driver.

8. The resistance change memory according to claim 5, wherein
the first bit line is selected from the bit lines by the multiplexer, and the word lines are then sequentially selected by the address counter, and
the second bit line is then selected from the bit lines by the multiplexer, and the word lines are then sequentially selected by the address counter.

9. The resistance change memory according to claim 1, wherein
the power supply circuit generates a first voltage and a second voltage as the stress voltage, and
the write driver applies the first voltage to the resistive storage elements, and the word line driver applies the second voltage to the cell transistors.

10. The resistance change memory according to claim 1, wherein
the word lines include redundancy word lines, and the address counter counts the word lines.

11. The resistance change memory according to claim 1, wherein
the bit lines and the source lines respectively include redundancy bit lines and redundancy source lines, and the address counter counts the bit lines and the source lines.

12. The resistance change memory according to claim 1, wherein
a magnetic field is applied to the memory cells while the stress voltage is being applied to the memory cells.

13. The resistance change memory according to claim 1, wherein
the resistive storage element includes a magnetic tunnel junction (MTJ) element.

14. The resistance change memory according to claim 13, wherein
the MTJ element comprises a reference layer, a storage layer, and an insulating layer disposed between the reference layer and the storage layer, and
the magnetic field applied to the memory cells is antiparallel to the magnetization direction of the reference layer.

15. The resistance change memory according to claim 13, wherein
the MTJ element comprises a reference layer, a storage layer, and an insulating layer disposed between the reference layer and the storage layer, and
the magnetic field applied to the memory cells is in a direction oblique to the magnetization direction of the reference layer.

16. A test method of a resistance change memory, the test method comprising:
selecting a first word line from word lines by an address counter;
driving the first word line by a word line driver;
selecting a first bit line and a first source line from bit lines and source lines by the address counter;
applying a stress voltage across the first bit line and the first source line by a write driver, and then passing a stress current through a first memory cell selected by the first word line;
incrementing the address counter to select a second word line from the word lines;
driving the second word line by the word line driver;
incrementing the address counter to select a second bit line and a second source line from the bit lines and the source lines; and
applying the stress voltage across the second bit line and the second source line by the write driver, and then passing a stress current through a second memory cell selected by the second word line.

17. The test method according to claim 16, wherein
the first word line is activated by the write driver, and the bit lines are then sequentially selected by a multiplexer, and
the second word line is then activated by the write driver.

18. The test method according to claim 16, wherein
the first bit line is selected from the bit lines by a multiplexer, and the word lines are then sequentially selected by the address counter, and
the second bit line is then selected from the bit lines by the multiplexer, and the word lines are then sequentially selected by the address counter.

19. The test method according to claim 16, wherein
a first voltage is applied to a resistive storage element included in the first memory cell by the write driver, and
a second voltage is applied to a cell transistor included in the first memory cell by the word line driver.

20. The test method according to claim 16, wherein
a magnetic field is applied to the first memory cell while the stress voltage is being applied to the first memory cell.

21. The test method according to claim 16, wherein
the magnetic field applied to the first memory cell is antiparallel to the magnetization direction of a reference layer of a magnetic tunnel junction (MTJ) element included in the first memory cell.

22. The test method according to claim 16, wherein
the magnetic field applied to the first memory cell is in a direction oblique to the magnetization direction of a reference layer of a magnetic tunnel junction (MTJ) element included in the first memory cell.

* * * * *